United States Patent [19]

Kobayashi et al.

[11] 4,169,913
[45] Oct. 2, 1979

[54] COATED TOOL STEEL AND MACHINING TOOL FORMED THEREFROM

[75] Inventors: Mitsunori Kobayashi; Yoshihiko Doi; Masaaki Tobioka; Takaharu Yamamoto, all of Itami, Japan

[73] Assignee: Sumitomo Electric Industries, Ltd., Japan

[21] Appl. No.: 882,893

[22] Filed: Mar. 1, 1978

[51] Int. Cl.² .............................................. B32B 15/18
[52] U.S. Cl. .................... 428/217; 428/409; 428/472; 428/539; 428/911
[58] Field of Search ............... 428/457, 469, 472, 538, 428/539, 911, 409, 217

[56] References Cited

U.S. PATENT DOCUMENTS

| 3,874,900 | 4/1975 | Post et al. | 428/457 X |
|---|---|---|---|
| 3,895,923 | 7/1975 | Wakefield | 428/457 X |
| 3,922,405 | 11/1975 | Komatsu et al. | 428/457 X |
| 3,988,515 | 10/1976 | Hashimoto et al. | 428/457 X |
| 4,018,631 | 4/1977 | Hale | 428/472 X |
| 4,019,873 | 4/1977 | Reiter | 428/457 X |
| 4,066,821 | 1/1978 | Cook et al. | 428/539 |
| 4,075,376 | 2/1978 | Jaeger | 428/457 X |
| 4,079,163 | 3/1978 | Tanaka | 428/457 X |
| 4,104,096 | 8/1978 | Gass et al. | 428/472 X |

*Primary Examiner*—Harold Ansher
*Attorney, Agent, or Firm*—Wenderoth, Lind & Ponack

[57] ABSTRACT

There is provided a coated tool steel having a tool steel substrate and at least one layer of a hard film overcoated on the substrate. The film consists of a B-1 type solid solution selected from carbides, nitrides and carbonitrides of at least one of titanium, zirconium or hafnium, and the breadth of the peak, at half maximum intensity, of Cu-Kα diffraction from the (200) plane of the film, being not less than 0.4 degree on a 2θ scale. The invention further provides a machine tool having at least one cutting part thereof formed from the coated tool steel described above. The coated steel provided herein has excellent wear resistance.

5 Claims, 4 Drawing Figures

COATED TOOL STEEL AND MACHINING TOOL FORMED THEREFROM

The present invention relates to a coated tool steel and a machining tool formed from the coated tool steel.

It is known that a sintered hard material such as cermet and cemented carbide, or a tool steel such as carbon tool steel, alloyed tool steel and high speed steel is overcoated with carbide, nitride or carbonitride of (titanium, zirconium and hafnium) so as to improve performance of a tool, i.e., to lengthen the tool's life and to make it possible to use it under severer conditions than those for a non-coated tool, by combining the toughness of a substrate with the wear resistance of the coating.

An object of the present invention is to provide an improved tool steel coated with a hard material and a machining tool formed from the coated tool steel.

Other objects and features of the present invention will be apparent from the following description of the invention with reference to the accompanying drawings, in which.

Figure 1:
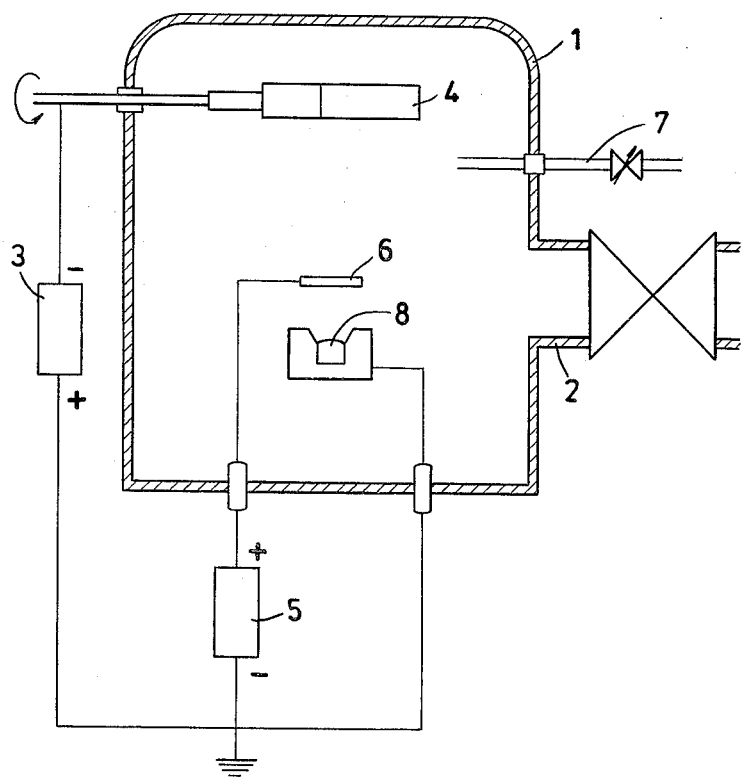
FIG. 1 is a diagrammatical view of an ion plating apparatus for making the coated tool steel of the invention.
Figure 3:
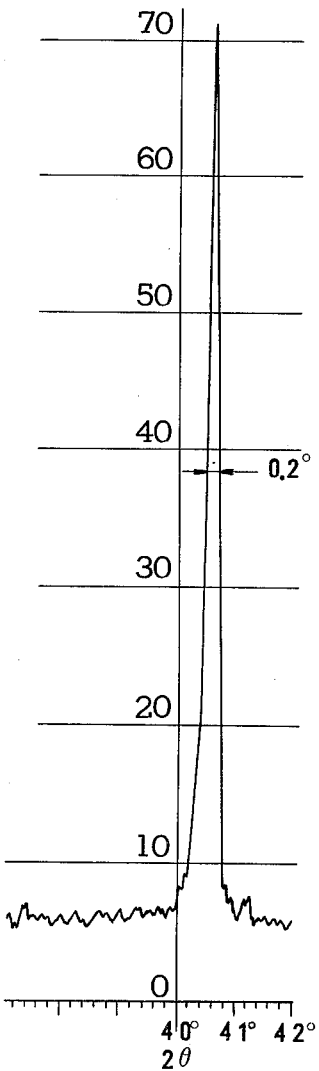
FIG. 2 and 3 are charts showing Cu-Kα ray diffraction spectrum.
Figure 2:
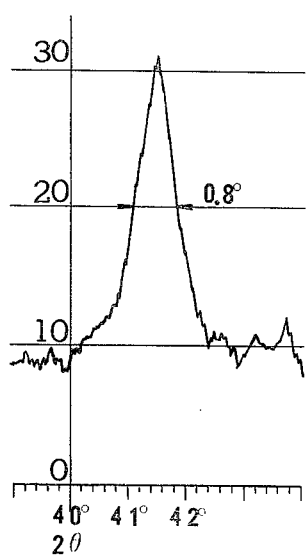

In order to analyze the crystal structure of a material, X-ray diffraction is generally employed. However, as to the half value width of an X-ray diffraction spectrum, there are different views. According to one view, it relates to a density of lattice defect which is caused by dislocation or the like, and to crystal disorder in a material. That is, the larger the half value width, the greater the density of lattice defect or the disorder of the crystal lattice.

Heretofore, a coating which has a greater half value width has been avoided since it might have worse properties. However, surprisingly, the inventors have found that a coating having a greater half value width is more effective for a machining tool. It has been revealed that a tool which has a coating with a greater half value width exhibits a larger wear resistance, especially, abrasive wear resistance, despite the fact that coatings have the same composition. Although the principle and mechanism rendering this superiority have not yet been perfectly elucidated, it is thought that the wearing is caused by the accumulation of plastic deformations and cracking, and if a coating has a greater density of lattice defects such as dislocation or crystal disorder, further dislocation is limited, i.e., plastic deformation is difficult to occur and little cracking takes place due to the greater rigidity of coating.

Now, carbide, nitride or carbonitride (any of which can contain oxygen or boron) of at least one of titanium, zirconium or hofnium generally form B-1 type solid solution. That is, these compounds belong to the same crystal system. Therefore, when a plane for X-ray diffraction is once determined, the peak of the diffraction spectrum can be determined.

The half value width of X-ray diffraction spectrum varies, depending on the diffraction plane. However, since the half value width of the peak on the same diffraction plane of the same material is constant, the half value width can be estimated by specifying the plane index and X-rays.

In view of conveniences of measurement due to greater intensity of diffraction, the inventors have selected the (200) plane and Cu-Kα ray among X-rays, as the basis of determining the half value width.

In the present invention, a substrate for coating can be selected from any material which is used as a tool, but a tool steel is most preferable.

At present, machining tools formed from tool steel such as carbon tool steel, alloyed tool steel or high speed steel are widely used. These tools are exposed to severe conditions of use which may break a cemented carbide tool, in machining such as interrupted punching or cutting applied with strong mechanical shocks, in machining such as low speed cutting or wet-cutting which may often cause adhesion of tool, and in machining under heavy load cutting which requires a greater mechanical strength.

As for a cemented carbide tool, since it is applied to cutting at a higher speed than a tool of tool steel, relatively greater adhesive wear resistance together with the abrasive wear resistance is required. In contrast, for a tool of, abrasive wear resistance is especially required. Therefore, the coating of the invention having a greater half value width is most suitable for tool steels. Further, the coating of the invention is especially suitable for high speed steel since among tool steels, it is used under such conditions that it requires higher abrasive wear resistance than carbon tool steel and alloyed tool steel.

Any conventional coating of B-1 type solid solution over the surface of tool steel has a half value width less than 0.2° in terms of 2 θ in diffraction maximum from the (200) plane. However, in the present invention, the half value width of coating is adjusted to be equal to or more than 0.4°, thereby making it possible to obtain a superior tool.

There are various kinds of tools of tool steel. Most of them are used again by regrinding the worn-out portion. When a tool is reground, the coating thereof is removed. Therefore, the manner of regrinding is important. If the tool is of throw-away type, of course the coating of the present invention is effective. As such tools, there are the throw-away insert, center drill and end mill of small size.

As for the tools which are used again, the manner of regrinding is generally classified into the following four cases.

In the first case, a tool such as tool bit or tipped tool is ground over the whole surface of a cutting part. As a result, it is necessary to overcoat the tool whenever it is reground since the coating is entirely removed. Therefore, the application of the coating of the invention to this kind of tool is not economical.

In the second case, a tool such as a drill, reamer, broach reamer or certain end mill is to be reground at the end thereof when it is worn out. As a result, a coating still remains at the margin of the cutting edge. Therefore, the application of the coating of the invention is effective for a core drill or reamer, and may be suitable for a certain drill or end mill.

In the third case, a tool such as ordinary end mill or regular milling cutter is to be reground at a flank of a cutting part when it is worn out. Although a coated film still remains at a face of a cutting part, the performance of the tool is considerably lowered. However, the coating of the invention is suitable for an expensive tool.

In the fourth case, a tool such as gear cutter including hob, formed cutter, tangenital tool, forming tool or broach is to be reground at only a face of a cutting part.

As a result, a coated film remains at a flank. Surprisingly, when the coated film remains at a flank, the tool life is hardly reduced. Therefore, these tools are most suitable for applying the coating of the present invention.

The inventors used a specific ion plating apparatus for forming a coating of the invention, and determined, as a result of experiments, the conditions that maximize the half value width of diffraction spectrum. However, as far as the density of lattice defect can be increased, a coated film may be formed by any other method such as physical vapor deposition process and chemical vapor deposition process. Further, the density of lattice defect can be increased by applying ion implantation to a film having a lower density of lattice defect.

The composition of coated film is a carbide, nitride or carbonitride (any of which can contain oxygen and/or boron) of at least one of titanium, zirconium and hafnium since these have higher hardness and lower reactivity when working. The coated film can be further overcoated by another film of the same or different composition. Still further, a slight amount of metal such as nickel or cobalt can be contained in the composition.

Among the above comounds, carbide, nitride and carbonitride of titanium are superior, but especially, titanium carbonitride is the most effective.

The reason why $Ti(C,N)_z$ is most preferred is as follows: TiC has a very high hardness and excellent abrasive wear resistance, but poor micro-chipping resistance. On the other hand, TiN has a hardness of about 60 to 70% relative to TiC, while it has a greater micro-chipping resistance. Therefore, when $Ti(C,N)_z$ is coated over a tool which is used under conditions that readily cause chipping and abrasive wear, there can be obtained a tool which has the most well-balanced properties.

The coated tool steel of the invention can be applied to various machining tools such as throw-away inserts, reamers, tangential tools, taps, gear cutters, broaches, drills, end mills and milling cutters.

FIG. 1 is a diagrammatical view showing an ion plating apparatus for making a coated tool steel of the invention. In the Figure, the numeral 1 designates a vacuum chamber which is exhausted by a pipe 2. In the chamber 1 are disposed a substrate 4 supplied with negative power from a power source 3, an ionizing electrode 6 supplied with positive power from an ionizing power source 5, a reaction gas supply pipe 7, and a source material 8 to be heated and evaporated by an electron beam.

In operation, the electron beam irradiates the source material 8, which is in turn melted and evaporated. The metal vapor is ionized to become positive by the ionizing electrode 6, and is pulled towards the tool steel substrate 4 which is supplied with high negative power, while reacting with the reaction gas. The vapor deposits on the surface of substrate 4 to form a film.

In order to illustrate the present invention, reference is now to be made to the following Examples. Throughout the Examples, the half value width is the breadth of the peak, at half maximum intensity of diffraction spectrum of Cu-K$\alpha$ rays which is measured by a diffractometer using copper target and nickel filter, on the (200) plane, on a 2 $\theta$ scale.

EXAMPLE 1

High speed steel (AISI T5) of HRC (Rockwell C Scale Hardness) 65.1 was formed into an ISO SNUN432 substrate. Using an ion plating apparatus of FIG. 1, titanium was heated and evaporated by electron beam, ionized at the ionizing potential of +60 V, and deposited on the substrate for 2 hours at the substrate potential of −1 KV in acetylene atmosphere under $4 \times 10^{-4}$ Torr. The throw-away insert thus obtained was cut and examined, revealing that the insert was coated with titanium carbide of 5 micron in thickness and the hardness of the insert was HRC 65.2, maintaining approximately the original hardness of substrate. The Cu-K$\alpha$ ray diffraction maximum from the (200) plane of coating provided a half value width of 0.6°.

For a comparison, AISI T 5 high speed steel was formed into an ISO SNUN432 substrate, coated with titanium carbide by a conventional chemical vapor deposition, and heat-treated. The hardness of the specimen was HRC 65.5, and the thickness of titanium carbide coating was 5 micron. The Cu-K$\alpha$ ray diffraction maximum from the (200) plane of coating provided a half value width of 0.2°.

JIS SCM 3 workpiece of 200 mm in outside diameter was cut by the insert of the invention at a cutting speed of 40 m/min, a depth of cut of 2 mm, and a feed of 0.36 mm/rev for 40 minutes, resulting in flank wear of 0.22 mm and crater wear of 0.05 mm. On the other hand, when the same workpiece as above was cut by the insert for comparison under the same conditions, the flank and crater wear reached 0.40 mm and 0.15 mm, respectively. As apparent, the insert of the invention showed a far superior wear resistance.

EXAMPLE 2

AISI M2 high speed steel of HRC 64.4 was formed into an ISO SNUN432 substrate. Using the ion plating apparatus of FIG. 1, titanium was heated and evaporated by electron beam, ionized at the ionizing potential of +50 V, and deposited on the substrate for 3 hours at the substrate potential of -0.9 KV in nitrogen atmosphere under $6 \times 10^{-4}$ Torr. The throw-away insert thus obtained was cut and examined, revealing that the substrate was coated with titanium nitride of 8 micron in thickness and the insert had a hardness of HRC 64.2, maintaining substantially the same hardness as the substrate. The Cu-K$\alpha$ ray diffraction spectrum from the (200) plane of coating provided a diffraction maximum having a half value width of 0.6°.

For the purpose of comparison, the same AISI M2 high speed steel as above was formed into an ISO SNUN432 substrate, coated with titanium nitride by a conventional chemical vapor deposition process, and then heat-treated. The specimen had a hardness of HRC 64.6 and was found to have a coating of titanium nitride of 8 microns in thickness. The Cu-K$\alpha$ ray diffraction maximum from the (200) plane of coating had a half value width of 0.2°.

Wear resistance of the insert of the invention and the insert for comparison were examined by milling SCM3 workpiece at a cutting speed of 30 m/min, a depth of cut of 2 mm, and a feed of 0.169 mm/rev. Flank wear of the insert of the invention reached 0.10 mm in a 30 minute machining, while flank wear of the insert for comparison reached 0.20 mm, demonstrating that the insert of the invention has a far superior wear resistance.

EXAMPLE 3

Figure 4:
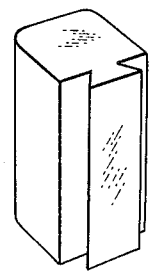
FIG. 4 is a perspective view of a tangential tool honing a coating of the hard material.

AISI m7 high speed steel was formed into a tangential tool as shown in FIG. 4. Using the ion plating apparatus of FIG. 1, titanium was heated and evaporated by an electron beam, ionized at the ionizing potential of +40 V, and deposited on the tool for 2 hours at a substrate potential of -0.6 KV in a mixed gas under the total pressure of $5 \times 10^{-4}$ Torr, in which the partial pressure of acetylene was $2 \times 10^{-4}$ Torr and the partial pressure of nitrogen was $3 \times 10^{-4}$ Torr.

In the same manner as above except that the tangential tool of AISI M7 high speed steel was heated to 500° C., titanium was deposited on the tool for one hour and a half, thus obtaining a tool for comparison.

The tool of the invention and the tool for comparison had hardness of HRC 64.2 and 64.3, and coating of titanium carbonitride of 3.1 and 3.5 microns in thickness, respectively. In these respects, there was no substantial difference between the two tools. However, in the tool of the invention, the half value width of the coating was 0.7°, while in the tool for comparison, it was 0.3°.

AISI 1049 crank shaft pin for automobiles was subjected to turning by using the tool of the invention at a cutting speed of 22 to 25 m/min, a feed of 0.08 mm/min and a cutting depth of 2.5 to 3 mm in the presence of cutting oil. The tool life was evaluated by the number of workpieces machined until the maximum flank wear reached 0.3 mm. In the same manner, the life of the tool for comparison was also evaluated. As a result, as many as 250 pieces were machined by the tool of the invention, whereas 180 pieces were machined by the conventional tool for comparison.

EXAMPLE 4

Using the ion plating apparatus of FIG. 1, zirconium was heated and evaporated by an electron beam, ionized by the ionizing potential of +40 V, and deposited on a substrate of AISI m2 high speed steel center drill of 6 mm in diameter and 60° in lathe center angle at the substrate potential of −0.6 KV for 6 hours in a mixed gas atmosphere under the total pressure of $5.1 \times 10^{-4}$ Torr in which partial pressures of oxygen, nitrogen and acetylene were $0.1 \times 10^{-4}$ Torr, $3 \times 10^{-4}$ Torr and $2 \times 10^{-4}$ Torr, respectively. In a similar manner, the same center drill as above was treated for 10 hours at the substrate potential of −9 KV.

As a result of examination of the tools thus obtained, the former and latter had hardness of HRC 63.8 and 63.6, and zirconium oxycarbonitride coatings of 4.6 and 4.2 micron in thickness, respectively. That is, there was no substantial difference between the two tools in hardness and coating thickness. However, the former had a half value width of 0.8° on the (200) plane of coating, while the latter had 0.3° on the same plane.

Using these two center drills, JIS SCM21 workpiece was drilled by 1140 rpm and a feed of 0.03 mm per edge in the presence of cutting oil. The former center drill of the invention was capable of drilling 15000 holes during its tool life, but with the latter, when 8500 holes were drilled, its tool life expired.

EXAMPLE 5

Using the ion plating apparatus of FIG. 1, hafnium was heated and evaporated by an electron beam, ionized at ionizing potential of +50 V, and deposited on JIS SKH9 reamer of 10 mm in diameter for 2 hours at the substrate potential of −0.7 KV in a mixed gas atmosphere under the total pressure of $3 \times 10^{-4}$ Torr in which partial pressures of nitrogen and acetylene were $2 \times 10^{-4}$ Torr and $1 \times 10^{-4}$ Torr, respectively.

The same reamer as above was treated in the same manner by the same apparatus. Hafnium was evaporated by electron beam, and ionized at +50 V. The substrate, which was heated at 500° C. instead of applying electrical potential, was held for 1 hour in the same mixed gas atmosphere.

The reamer of the invention and the conventional reamer thus coated had hardness of HRC 64.2 and 64.5, and hafnium carbonitride coatings of 0.8 and 0.7 micron in thickness, respectively. However, in the tool of the invention, the half value width on the (200) plane of coating was 0.4°, while in the conventional tool, it was 0.2°.

Using the reamers, a drilled bore of 9.90 mm in diameter in JIS S20C workpiece was reamed at 320 rpm and feed of 0.3 mm/rev in the presence of cutting oil. With the coated reamer of the invention, the life thereof expired at a cutting length of 8 mm, while with the conventional reamer its life expired at 5.5 mm.

EXAMPLE 6

JIS SKH52 high speed steel broach was treated in the same manner as Example 3. Using this coated broach, JIS SUH661 super heated-resistant steel was machined at a cutting speed of 3 m/min, and average depth of cut of 0.03 mm per edge in the presence of cutting oil. The length of 4.5 m was machined by the broach of the invention until its life expired, but the length of 3.5 m was machined by the conventional broach.

EXAMPLE 7

JIS SKH55 high speed steel drill of 10 mm in diameter was treated in the same manner as Example 1. With the coated drill, JIS S12C workpiece was drilled at 1310 rpm, feed of 0.15 mm/rev and depth of hole of 24 mm in the presence of cutting oil. 4000 holes were drilled by the coated drill of the invention whereas 3200 holes were drilled by the conventional drill before the expiry of tool life.

EXAMPLE 8

JIS SKH57 high speed steel radius end mill of 22 mm in diameter and 1 mm in radius was treated in the same manner as Example 3. With this coated tool, a non-magnetic steel was machined to form a groove of 22 mm in width, 6 mm in depth and 50 mm in length at a cutting speed of 15 mm/min and feed of 0.05 mm per edge in the presence of cutting oil. As a result, 16 grooves were formed by the tool of the invention, whereas 10 grooves were formed by the conventional tool before the expiry of tool life.

EXAMPLE 9

JIS SKH57 hob of 1 mm in module and 20° in pressure angle was treated in the same manner as Example 3, and applied to gear cutting of JIS S45C workpiece at a cutting speed of 106 m/min and 1061 rpm in the presence of cutting oil. 190 pieces could be machined. However, when a conventional tool cut only 130 pieces, the tool life expired.

EXAMPLE 10

JIS M17×1 hand tap of AISI M7 high speed steel was treated in the same manner as Example 3, and applied to tapping of JIS FC25 workpiece at 175 rpm in the presence of cutting oil. 5300 screws were made by the tool of the invention, while 3900 screws were made by a conventional hand tap before the tool life expired.

EXAMPLE 11

JIS SK1 carbon tool steel and JIS SKS1 alloyed tool steel were formed into ISO SNUA432 throw-away inserts. Using the ion plating apparatus of FIG. 1, titanium was heated and evaporated by an electron beam, ionized at ionizing potential of +35 V, and deposited on the inserts for 2 hours at the substrate potential of −0.6 KV in acetylene atmosphere under the pressure of 3.4 ×10⁻⁴ Torr.

The throw-away inserts (former as insert A, latter as insert B) were examined,. The inserts A and B had hardness of HRC 63.1 and 63.5, and titanium carbide coatings of 5.8 and 5.9 micron in thickness, respectively. Both of inserts had a half value width of 0.6° on the (200) plane of coating.

For the purpose of comparison, SNUA432 inserts of JIS SK1 and JIS SKS1 were coated with titanium carbide by a conventional chemical vapor deposition process, and heat-treated. The inserts (former as insert C, latter as insert D) thus coated were examined. The inserts C and D had hardness of HRC 63.2 and 63.5 and titanium carbide coatings of 6.1 and 6.3 micron, respectively. Both of the inserts C, D had a half value width of 0.2° on the (200) plane of coating.

The inserts A, B, C and D were applied to cutting JIS SCM 3 workpiece at a cutting speed of 5 m/min, cutting depth of 2 mm and feed of 0.11 mm/rev for 90 minutes, providing the following results.

| Insert | A | B | C | D |
| --- | --- | --- | --- | --- |
| Flank wear (mm) | 0.15 | 0.11 | .022 | 0.18 |
| Crater wear (mm) | 0.02 | 0.01 | 0.02 | 0.02 |

As apparent, inserts A and B of the present invention exhibited performances far superior to the conventional inserts C and D.

EXAMPLE 12

Using the ion plating apparatus of FIG. 1, titanium was heated and evaporated by an electron beam, ionized at ionizing potential of +40 V, and desposited on ISO SNUA432 throw-away insert of JIS SKH57 high speed steel for 3 hours at the substrate potential of −0.8 KV in a mixed gas atmosphere under 5 ×10⁻⁴ Torr, in which partial pressures of diborane and nitrogen were 1 ×10⁻⁴ Torr and 4 ×10⁻⁴ Torr, respectively.

For the purpose of comparison, the same insert as above was treated for 2 hours in the same manner except that the substrate was heated to 500° C. instead of applying electrical potential.

The insert of the invention and the conventional insert had hardness of HRC 67.1 and 66.8, and coatings of titanium boronitride of 7.5 and 7.7 micron in thickness, respectively. That is, there was no substantial difference between them. However, the former had a half value width of 0.5°, whereas the latter had 0.3° on the (200) plane of coating.

JIS SCM3 workpiece was cut by the inserts at a cutting speed of 50 m/min, cutting depth of 2 mm and feed of 0.30 mm/rev. In 30 minutes, flank and crater wear of the insert of the invention reached 0.02 mm and 0.04 mm, respectively. On the other hand, in 30 minutes, flank and crater wears of the conventional insert reached 0.35 mm and 0.05 mm, respectively.

As apparent from the above, the coated insert of the invention showed superior performances.

EXAMPLE 13

JIS SKH57 high speed steel was formed into ISO SNUA432 throw-away insert. Using the ion plating apparatus of FIG. 1, vapor mix of titanium and zirconium produced by electron beam was ionized at ionizing potential of +40 V, and deposited on the substrate at the substrate potential of −0.9 KV in acetylene atmosphere under 4×10⁻⁴ Torr for 3 hours.

For the purpose of comparison, the same insert as above was treated for 2 hours in the same manner except that the substrate was heated to 500° C. instead of applying electrical potential thereto.

The inserts thus coated were examined. The insert of the invention and the conventional insert had a hardness of HRC 66.9 and 67.1, and coatings of mixed carbides of titanium and zirconium of 6.2 and 6.5 microns, respectively. However, the half value width of the insert of the invention was 0.6° on the (200) plane of coating, while that of the conventional insert was 0.3°.

JIS SCM3 workpiece was cut by these inserts at a cutting speed of 50 m/min, cutting depth of 2 mm and feed of 0.36 mm/rev for 30 minutes. The flank and crater wear of the insert of the invention reached 0.24 mm and 0.09 mm, respectively, while those of the conventional insert reached 0.44 mm and 0.13 mm, respectively, before the tool life expired. As apparent, the insert of the invention had superior performance.

As described above, the tools of the invention have excellent wear resistance. However, in such tools which have a half value width less than 0.4° on the (200) plane of coating, inferior wear resistance was observed. Therefore, by forming a coating of which the half value width is equal or more than 0.4° on the (200) plane, coated tool steels having wear resistance superior to conventional tool steels can be obtained.

It is to be noted that the concept set forth in the present invention is applicable also to alumina as a source material for coating.

In the present invention, the thickness of coating is less than 20 microns, but perferably ranges from 0.5 to 10 microns.

What is claimed is:

1. A coated tool steel comprising a tool steel substrate and at least one layer of a hard film overcoated on the substrate, the film consisting of a B-1 type solid solution selected from the group consisting of carbides, nitrides and carbonitrides of at least one of titanium, zirconium or hafnium, and the breadth of the peak, at half maximum intensity, of the Cu-Kα ray diffraction from the (200) plane of the film being not less than 0.4 degree on a 2 θ scale.

2. A coated tool as claimed in claim 1, wherein the solid solution contains at least one element selected from oxygen and boron.

3. A coated tool steel comprising a tool steel substrate and at least one layer of a hard film overcoated on the substrate, the film consisting of a B-1 type solid solution selected from the group consisting of titanium carbide, titanium nitride, titanium carbonitride, titanium oxycarbide, titanium oxycarbonitride, titanium oxynitride and titanium boronitride, and the breadth of the peak, at half maximum intensity, of the Cu-Kα ray diffraction from the (200) plane of the film being not less than 0.4 degree on a 2 θ scale.

4. A machining tool having at least at a cutting part thereof a coated tool steel comprising a tool steel substrate and at least one layer of a hard film overcoated on the substrate, the film consisting of a B-1 type solid solution selected from the group consisting of carbides, nitrides and carbonitrides of at least one of titanium, zirconium or hafnium, and the breadth of the peak, at half maximum intensity, of the Cu-Kα ray diffraction from the (200) plane of the film being not less than 0.4 degree on a 2 θ scale.

5. A machining tool as claimed in claim 4, wherein the solid solution contains at least one element selected from the group consisting of oxygen and boron.